(12) United States Patent
Kim

(10) Patent No.: US 7,085,298 B2
(45) Date of Patent: Aug. 1, 2006

(54) TUNNEL JUNCTION UTILIZING GAPSB, ALGAPSB

(75) Inventor: Jin K. Kim, St. Louis Park, MN (US)

(73) Assignee: Finisar Corporation, Sunnyvale, CA (US)

( * ) Notice: Subject to any disclaimer, the term of this patent is extended or adjusted under 35 U.S.C. 154(b) by 332 days.

(21) Appl. No.: 10/697,028

(22) Filed: Oct. 31, 2003

(65) Prior Publication Data

US 2005/0094692 A1    May 5, 2005

(51) Int. Cl.
*H01S 3/04* (2006.01)
*H01S 5/00* (2006.01)

(52) U.S. Cl. .................................. 372/43.01
(58) Field of Classification Search . 372/43.01–46.016
See application file for complete search history.

(56) References Cited

U.S. PATENT DOCUMENTS

| | | | |
|---|---|---|---|
| 6,493,372 B1* | 12/2002 | Boucart et al. ............... | 372/96 |
| 6,493,373 B1 | 12/2002 | Boucart et al. | |
| 6,765,238 B1* | 7/2004 | Chang et al. ............... | 257/104 |
| 6,771,680 B1* | 8/2004 | Bour et al. ............... | 372/43.01 |
| 6,810,065 B1* | 10/2004 | Naone .......................... | 372/96 |
| 6,813,293 B1* | 11/2004 | Johnson et al. ......... | 372/46.015 |
| 6,931,042 B1* | 8/2005 | Choquette et al. .......... | 372/103 |
| 6,933,539 B1* | 8/2005 | Bhat et al. ................... | 257/104 |
| 2003/0103543 A1* | 6/2003 | Moser et al. ................. | 372/96 |
| 2003/0156610 A1* | 8/2003 | Kwon .......................... | 372/45 |
| 2004/0217343 A1* | 11/2004 | Chang et al. ................ | 257/25 |
| 2004/0218655 A1* | 11/2004 | Tandon et al. ............... | 372/96 |
| 2005/0002430 A1* | 1/2005 | Ryou .......................... | 372/44 |
| 2005/0253164 A1* | 11/2005 | Bhat et al. .................. | 257/104 |
| 2006/0002444 A1* | 1/2006 | Wang et al. ................ | 372/50.1 |

OTHER PUBLICATIONS

Hall et al., "Electrically-pumped, single-epitaxial VCSELs at 1.55 micrometers with Sb-based Mirrors", Electronics Letters Online No. 19990965, May 20, 1999, Electrical and Computer Engineering Department, University of California, Santa Barbara, CA.*

Zhou et al., "Low-Power Phototransceiver Arrays With Vertically Integrated Resonant-Cavity LEDs and Heterostructure Phototransistors", IEEE Photonics Technology Letters, vol. 13, No. 11, Nov. 2001.*

J.K. Kim et al., "Epitaxially-Stacked Multiple-Active-Region 1.55μm Lasers For Increased Differential Efficiency," American Institute of Physics, May 31, 1999, pp. 3251-3253, vol. 74, No. 22, Electrical and Computer Engineering Department, University of California, Santa Barbara, California.

(Continued)

Primary Examiner—Hoang V. Nguyen
Assistant Examiner—Leith Al-Nazer
(74) Attorney, Agent, or Firm—Workman Nydegger

(57) ABSTRACT

A vertical cavity surface emitting laser (VCSEL) includes a substrate; a first mirror stack over the substrate; an active region having a plurality of quantum wells over the first mirror stack; a tunnel junction over the active region, a p-layer of the tunnel junction including GaPSb or AlGaPSb; and a second mirror stack over the tunnel junction. The p-layer including GaPSb or AlGaPSb can be used to form a tunnel junction with an n-doped layer of InP or AlInAs, or with a lower bandgap material such as InGaAs, AlInGaAs or InGaAsP. Such tunnel junctions are especially useful for a long wavelength VCSEL.

22 Claims, 2 Drawing Sheets

OTHER PUBLICATIONS

E. Hall et al., "Electrically-Pumped, Single-Epitaxial VCSELs at 1.55μm with Sb-based Mirrors," Electronics Letters Online No.: 19990965, May 20, 1999, Electrical and Computer Engineering Department, University of California, Santa Barbara, California.

Y. Kotaki et al., "GaInAsP/InP Surface Emitting Laser with Two Active Layers." Extended Abstracts of the 16th (1984 International) Conference on Solid State Devices and Materials, Kobe, 1984, pp. 29-32, Tokyo Institute of Technology, Yokohama, Japan.

* cited by examiner

TUNNEL JUNCTION UTILIZING GAPSB, ALGAPSB

BACKGROUND OF THE INVENTION

1. Field of the Invention

This invention relates to vertical cavity surface emitting lasers (VCSELs). More specifically, it relates to tunnel junctions for VCSELs.

2. Discussion of the Related Art

Vertical cavity surface emitting lasers (VCSELs) represent a relatively new class of semiconductor lasers. While there are many variations of VCSELs, one common characteristic is that they emit light perpendicular to a wafer's surface. Advantageously, VCSELs can be formed from a wide range of material systems to produce specific characteristics.

VCSELs include semiconductor active regions, which can be fabricated from a wide range of material systems, distributed Bragg reflector (DBR) mirrors, current confinement structures, substrates, and contacts. Some VCSELs, particularly those used at long-wavelengths, incorporate tunnel junctions. Because of their complicated structure, and because of their material requirements, VCSELs are usually grown using metal-organic chemical vapor deposition (MOCVD).

FIG. 1 illustrates a typical long-wavelength VCSEL 10 having a tunnel junction. As shown, an n-doped InP substrate 12 has an n-type electrical contact 14. An n-doped lower mirror stack 16 (a DBR) is on the InP substrate 12, and an n-type graded-index InP lower spacer 18 is disposed over the lower mirror stack 16. An InGaAsP or AlInGaAs active region 20, usually having a number of quantum wells, is formed over the InP lower spacer 18. Over the active region 20 is a tunnel junction 28. Over the tunnel junction 28 is an n-type graded-index InP top spacer 22 and an n-type InP top mirror stack 24 (another DBR), which is disposed over the InP top spacer 22. Over the top mirror stack 24 is an n-type conduction layer 9, an n-type cap layer 8, and an n-type electrical contact 26.

Still referring to FIG. 1, the lower spacer 18 and the top spacer 22 separate the lower mirror stack 16 from the top mirror stack 24 such that an optical cavity is formed. As the optical cavity is resonant at specific wavelengths, the mirror separation is controlled to resonate at a predetermined wavelength (or at a multiple thereof). At least part of the top mirror stack 24 includes an insulating region 40 that provides current confinement. The insulating region 40 is usually formed either by implanting protons into the top mirror stack 24 or by forming an oxide layer. In any event, the insulating region 40 defines a conductive annular central opening 42 that forms an electrically conductive path though the insulating region 40. When such a current confinement structure is adopted for a VCSEL, the tunnel junction 28 can also be placed above the current confinement structure (here, the insulating region 40).

In operation, an external bias causes an electrical current 21 to flow from the electrical contact 26 toward the electrical contact 14. The insulating region 40 and the conductive central opening 42 confine the current 21 such that the current flows through the conductive central opening 42 and into the tunnel junction 28. The tunnel junction converts incoming electrons into holes that are injected into the active region 20. Some of the injected holes are converted into photons in the active region 20. Those photons bounce back and forth (resonate) between the lower mirror stack 16 and the top mirror stack 24. While the lower mirror stack 16 and the top mirror stack 24 are very good reflectors, some of the photons leak out as light 23 that travels along an optical path. Still referring to FIG. 1, the light 23 passes through the conduction layer 9, the cap layer 8, an aperture 30 in electrical contact 26, and out of the surface of the vertical cavity surface emitting laser 10.

It should be understood that FIG. 1 illustrates a typical long-wavelength VCSEL having a tunnel junction, and that numerous variations are possible. For example, the dopings can be changed (say, by providing a p-type substrate), different material systems can be used, operational details can be tuned for maximum performance, and additional structures and features can be added.

While generally successful, VCSELs similar to that illustrated in FIG. 1 have problems. One problem in realizing commercial quality long wavelength VCSELs, which is addressed by the tunnel junction 28, is optical loss. In long wavelength VCSELs, it is often critical to limit optical losses. To that end, p-doped materials, which absorb more light than n-doped materials, are replaced by n-doped materials and the tunnel junction 28. That junction converts electron currents into hole currents that are injected into the active region. That way, long wavelength VCSELs can be made with a non-absorbing n-type mirror on both the top and the bottom.

Tunnel junctions used in semiconductor lasers are thin (say 10 nanometer), reversed biased structures. Such tunnel junctions are usually n++/p++ structures in which the both sides have a high doping density using usually a low diffusivity dopant. This enables a low voltage drop across the tunnel junctions, and low free carrier absorption and sufficient free carriers in the semiconductor lasers. Dopants for such tunnel junctions should provide a high doping level in semiconductor matrix and should not diffuse around so as to maintain a sharp doping profile. Because of their low diffusivity, silicon and carbon are used for n-type and p-type dopants in tunnel junctions, respectively, especially for non-indium containing GaAs based VCSELs. For Indium-Alloy-based VCSELs, which are more pertinent to long-wavelength VCSELs, however, high doping density for p-type using carbon is, however, difficult to obtain. For example, p-type doping density of AlInAs lattice matched to InP with conventional doping techniques is less than $5 \times 10^{19}$ cm$^{-3}$, which is an amount of doping density for a good tunnel junction with low voltage drop. Thus, a new long wavelength VCSEL would be beneficial. Even more beneficial would be a new tunnel junction suitable for use in long wavelength VCSELs. Still more beneficial would be a new tunnel junction with a material pair that inherently possesses a large band-offset, which allows construction of good tunnel junctions without having to dope both sides as heavily as in the prior art.

SUMMARY OF THE INVENTION

Accordingly, the present invention is directed to a tunnel junction suitable for use in long wavelength VCSELs that substantially obviates one or more of the problems due to limitations and disadvantages of the prior art.

An advantage of the present invention is to provide a tunnel junction for a VCSEL that utilizes a layer that includes GaPSb or AlGaPSb for its p-side. A tunnel junction according to the principles of the present invention includes such a p-side layer and an n-doped layer of InP, AlInAs, or of a lower bandgap material such as InGaAs, AlInGaAs or InGaAsP. Beneficially, such a tunnel junction is formed above quantum wells to form a VCSEL. Such VCSELs are particularly advantageous at long wavelengths.

A VCSEL having a tunnel junction constructed according to the principles of the present invention has a high p-doping density for the p-side of the tunnel junction, and thus has an enhanced conductive tunneling characteristic, which in turn results in an improved performance of the VCSEL.

In order to achieve these and other advantages and in accordance with the purpose of the present invention, as embodied and broadly described, a vertical cavity surface emitting laser may, for example, include a substrate; a first mirror stack over the substrate; an active region having a plurality of quantum wells over the first mirror stack; a tunnel junction over the active region, a p-layer of the tunnel junction including GaPSb or AlGaPSb; and a second mirror stack over the tunnel junction.

In another aspect of the present invention, a tunnel junction may, for example, include a p-layer including GaPSb or AlGaPSb.

In yet another aspect of the present invention, a long wavelength VCSEL may, for example, include an indium-based semiconductor substrate; a first mirror stack over the substrate; an active region having a plurality of quantum wells over the first mirror stack; a tunnel junction over the active region, wherein a p-layer of the tunnel junction includes GaPSb or AlGaPSb; and a second mirror stack over the tunnel junction.

Additional features and advantages of the invention will be set forth in the description that follows, and in part will be apparent from that description, or may be learned by practice of the invention.

BRIEF DESCRIPTION OF THE DRAWING

The accompanying drawings, which are included to provide a further understanding of the invention and which are incorporated in and constitute a part of this specification, illustrate embodiments of the invention and together with the description serve to explain the principles of the invention.

In the drawings.

Figure 1:
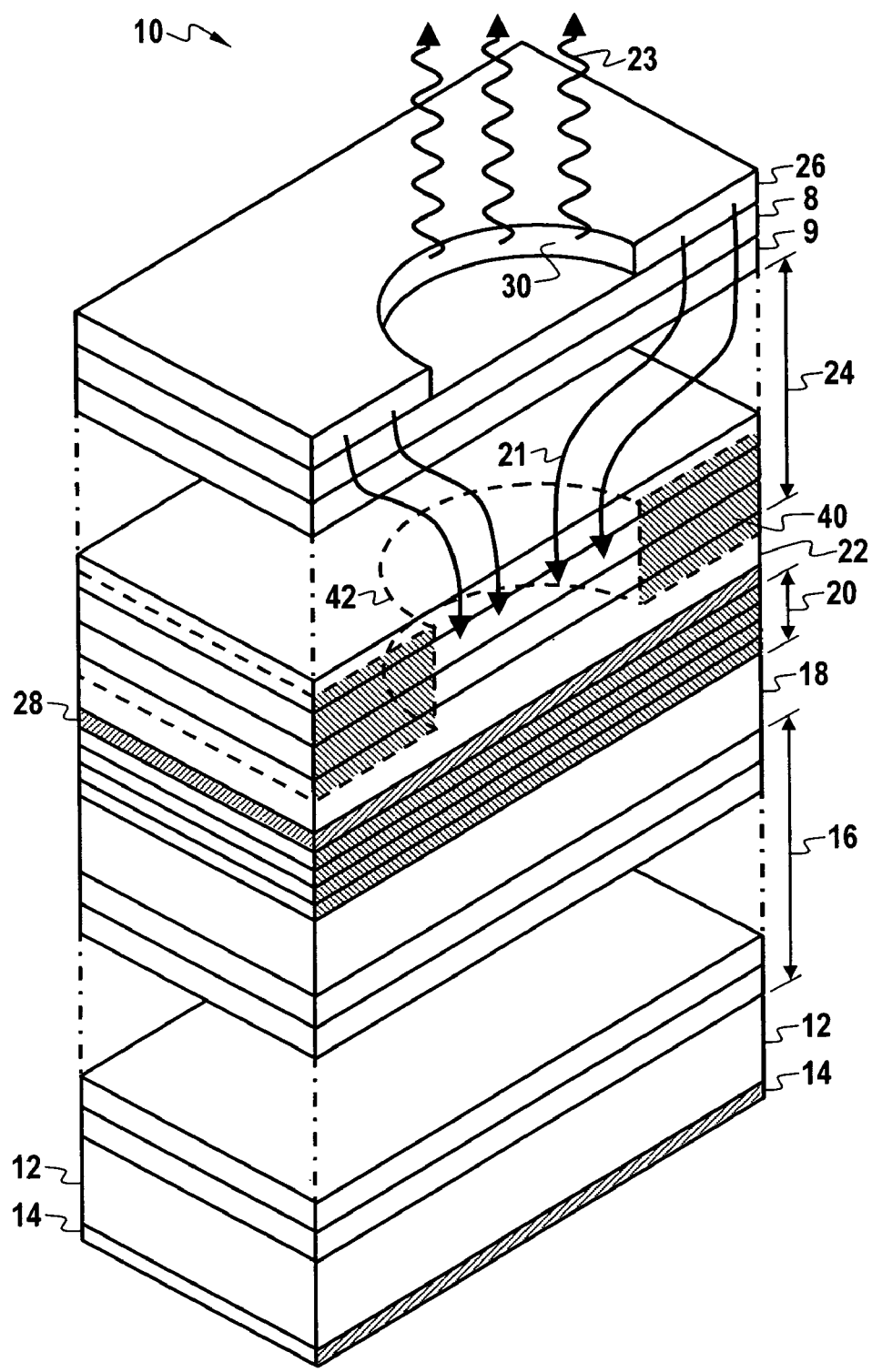
FIG. 1 illustrates a typical long-wavelength vertical cavity surface emitting laser.

Note that in the drawings that like numbers designate like elements. Additionally, for explanatory convenience the descriptions use directional signals such as up and down, top and bottom, and lower and upper. Such signals, which are derived from the relative positions of the elements illustrated in the drawings, are meant to aid the understanding of the present invention, not to limit it.

DETAILED DESCRIPTION OF THE ILLUSTRATED EMBODIMENTS

Reference will now be made in detail to embodiments of the present invention, examples of which are illustrated in the accompanying drawings.

The principles of the present invention are incorporated in a first embodiment including a VCSEL having a bottom DBR mirror grown on an InP substrate. An example of such a VCSEL is the VCSEL 100 illustrated in FIG. 2.

Figure 2:
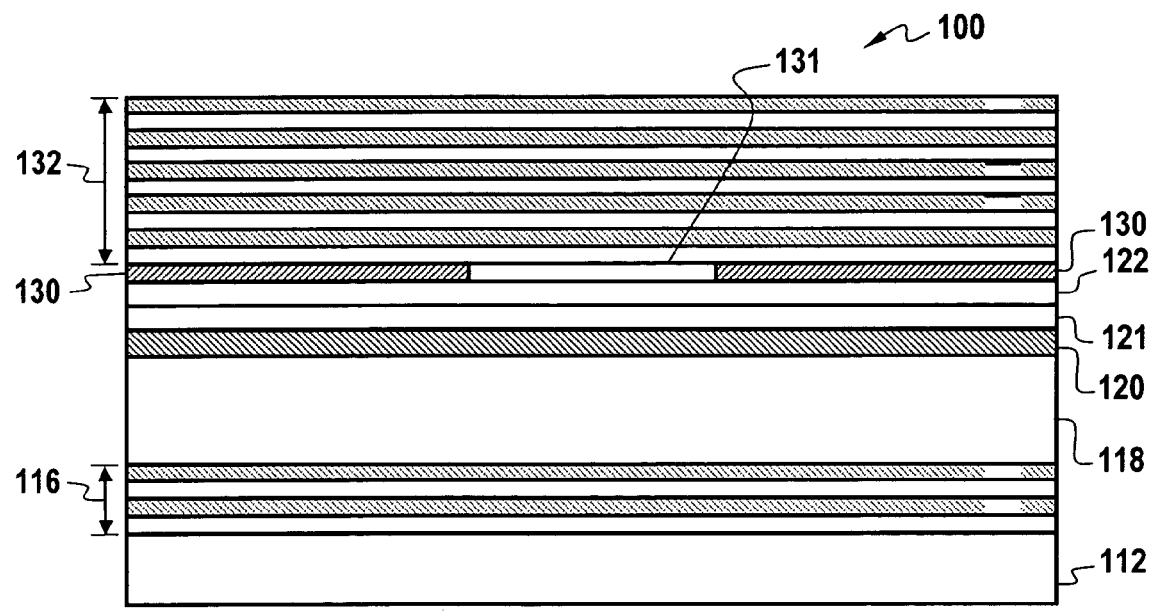
FIG. 2 illustrates a vertical cavity surface emitting laser that is in accord with the principles of the present invention.

As shown in FIG. 2, the VCSEL 100 includes an n-doped InP substrate 112 having an n-type electrical contact (not shown for clarity). Over the InP substrate 112 is an n-doped lower mirror stack 116 (a DBR) comprised of a plurality of alternating layers of AlGaInAs/AlInAs, InAlGaAs/InP or InGaAsP/InP. Over the lower mirror stack 116 is an n-doped InP spacer 118. The lower mirror stack 116 is beneficially grown on the InP substrate using, for example, common metal-organic and hydride sources like TMAl, TMGa, $PH_3$ and $AsH_3$ in an MOCVD process. Then, the InP spacer 118 is grown, also using MOCVD. An active region 120 comprised of P-N junction structures and having a number of quantum wells is then formed over the InP spacer 118. The composition of the active region 120 is beneficially InGaAsP, InGaAs, or AlInGaAs. Over the active region 120 is a p-type InP top spacer 121. Similar to the lower InP spacer 118, the p-type InP top spacer 121 is also grown using MOCVD.

Figure 3:
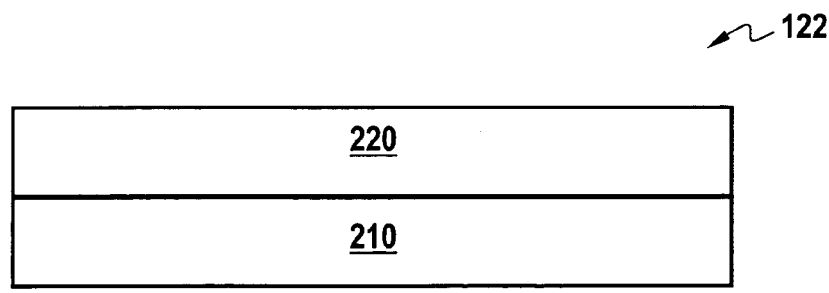
FIG. 3 illustrates a tunnel junction structure in the VCSEL illustrated in FIG. 2 that is in accord with the principles of the present invention.

Referring to FIG. 2 and FIG. 3, over the p-type InP top spacer 121 is a tunnel junction 122 comprised of a reverse biased n++/p++ junction. The tunnel junction includes a p-layer 210 that includes GaPSb or AlGaPSb. Metal Organic Chemical Vapor Deposition ("MOCVD") and Molecular Beam Epitaxy ("MBE") methods are utilized to grow the p-layer 210. For the MOCVD method, TMAl, TMGa, TMSb and $PH_3$ sources are used to grow the p-layer in a growth temperature range between about 400° C. and about 900° C. The growth rate and the composition of the p-layer can be easily controlled by adjusting group III and V source inputs. Doping is beneficially performed using, for example, a carbon source such as $CCl_4$ or $CBr_4$ such that the resulting p-doping is greater than about $5\times10^{19}$ cm$^{-3}$. When the MBE method is used to grow the p-layer 210, the Equivalent Beam Pressures ("EBP") of group V sources, such as Sb and P, are in a range of about $1\times10^{-7}$ to about $1\times10^{-3}$ torr, with the optimum EBP being approximately $1\times10^{-5}$ torr, and the growth rates of group III sources, such as Al and Ga, are less than about 10 μm/hour, with the optimum growth rate being approximately 1 μm/hour.

Still referring to FIG. 2 and FIG. 3, the tunnel junction 122 further includes an n-doped layer 220 of InP, AlInAs, or of a lower bandgap material such as InGaAs, AlInGaAs or InGaAsP. The n-doped layer 220 should also be heavily doped (greater than about $2\times10^{18}$ cm$^{-3}$) and very thin (less than about 100 nanometers). For a good lattice matching, the VCSEL 100 uses an InP n-type layer in the tunnel junction 122.

The conduction band level of GaPSb or AlGaPSb is relatively high compared to many III-V semiconductor materials. As a result, the material pair of the tunnel junction 122 according to this embodiment of the present invention allows construction of good tunnel junctions without having to dope both sides heavily. For example, the conduction-band offset between GaPSb and InP is believed to be approximately 0.5 eV. Since the band-gap of GaPSb is approximately 0.85 eV, only 0.35 eV of further conduction-band offset needs to be established with doping in order to make a good tunnel junction, which is much less amount of doping as compared with the conventional tunnel junctions in a VCSEL. Furthermore, since the band-gap of GaPSb or AlGaPSb is relatively small compared to the p-layers of the conventional tunnel junctions, the tunnel junction 122 according to this embodiment of the present invention shows an enhanced conductive tunneling characteristic.

Over the tunnel junction 122 is an n-type top mirror structure (which includes another DBR). As in the case of the lower mirror stack 116, the n-type top mirror stack 132 is beneficially comprised of a plurality of alternating layers of AlGaInAs/AlInAs, InAlGaAs/InP or InGaAsP/InP, and is beneficially grown using MOCVD. As shown in FIG. 2, an insulating structure 130 may be optionally provided between the tunnel junction 122 and the n-type top mirror stack 132 (or between the tunnel junction 122 and the active region 120). The insulating structure includes an opening 131, which enables current flow through the VCSEL 100. The result is a high-quality mirror stack 132 having current confinement.

With the mirror stack 132 formed, an n-type conduction layer (similar to the p-type conduction layer 9 of FIG. 1), an n-type GaAs cap layer (similar to the p-type GaAs cap layer 8 of FIG. 1), and an n-type electrical contact (similar to the p-type electrical contact 26 of FIG. 1) may be provided to complete the VCSEL 100.

The VCSEL 100 having a tunnel junction 122 constructed according to the principles of the present invention has significant advantages over prior art VCSELs. First, since a high p-doping density (higher than $5 \times 10^{19}$ cm$^{-3}$) is obtainable for the p-side of the tunnel junction with the carbon doping techniques, there is a lower voltage drop across the tunnel junction portion 122 in the VCSEL 100 as compared with the conventional VCSELs. Another advantage is that, since the band-gap of GaPSb or AlGaPSb is relatively small compared to the p-layers of the conventional tunnel junctions, the tunnel junction 122 shows an enhanced conductive tunneling characteristic. The overall result is a VCSEL with improved performance.

It should be understood that, while a tunnel junction according to the principles of the present invention is described in this section with a long wavelength VCSEL device, it could be used with other types of VCSEL or other devices for its intended purposes herein described. It should be further understood that, while a tunnel junction is provided over the active region 120 in this section, the number and/or location of the tunnel junction could be varied in VCSELs.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

What is claimed is:

1. A vertical cavity surface emitting laser, comprising:
   a substrate;
   a first mirror stack over the substrate;
   an active region having a plurality of quantum wells over the first mirror stack;
   a tunnel junction over the active region, a p-layer of the tunnel junction including GaPSb or AlGaPSb; and
   a second mirror stack over the tunnel junction.

2. A vertical cavity surface emitting laser according to claim 1, wherein an n-layer of the tunnel junction further includes a compound selected from the group consisting of InP, AlInAs, AlInGaAs, InGaAs and InGaAsP.

3. A vertical cavity surface emitting laser according to claim 1, further including an n-type spacer adjacent the active region, and wherein the first mirror stack is an n-type DBR.

4. A vertical cavity surface emitting laser according to claim 1, further including an p-type spacer adjacent the tunnel junction, and wherein the second mirror stack is an n-type DBR.

5. A vertical cavity surface emitting laser according to claim 1, further including:
   an n-type bottom spacer adjacent the active region, and wherein the first mirror stack is an n-type DBR; and
   an p-type top spacer adjacent the tunnel junction, wherein the first and second mirror stacks are each an n-type DBR.

6. A vertical cavity surface emitting laser according to claim 1, wherein the p-layer is grown by MOCVD or MBE.

7. A vertical cavity surface emitting laser according to claim 6, wherein the MOCVD grows the p-layer of the tunnel junction using TMAl, TMGa, TMSb and PH$_3$ in a temperature range between about 400° C. and about 900° C.

8. A vertical cavity surface emitting laser according to claim 6, wherein the MBE grows the p-layer of the tunnel junction at a condition where the Equivalent Beam Pressures of group V sources are in a range of about $1 \times 10^{-7}$ to about $1 \times 10^{-3}$ torr and the growth rates of group III sources are less than about 10 μm/hour.

9. A vertical cavity surface emitting laser according to claim 6, wherein the p-layer is doped with carbon with a concentration greater than about $2 \times 10^{18}$ cm$^{-3}$.

10. A vertical cavity surface emitting laser according to claim 1, wherein the active region includes one of InGaAs, InGaAsP and AlInGaAs.

11. A vertical cavity surface, emitting laser according to claim 1, wherein the first and second mirror stacks are lower and upper mirror stacks, respectively.

12. A tunnel junction having a p-layer including GaPSb or AlGaPSb.

13. A tunnel junction according to claim 12, wherein the p-layer is doped with carbon with a concentration greater than about $2 \times 10^{18}$ cm$^{-3}$.

14. A tunnel junction according to claim 12, further including an n-doped layer of a compound in the group consisting of InP, AlInAs, InGaAs, AlInGaAs, and InGaAsP.

15. A tunnel junction according to claim 14, wherein the n-doped layer is doped with a concentration greater than about $2 \times 10^{18}$ cm$^{-3}$.

16. A tunnel junction according to claim 14, wherein the n-doped layer is less than about 100 nanometers thick.

17. A tunnel junction according to claim 14, wherein the n-doped layer is doped with a concentration greater than about $2 \times 10^{18}$ cm$^{-3}$ and the n-doped layer is less than about 100 nanometers thick.

18. A long wavelength VCSEL, comprising:
   an indium-based semiconductor substrate;
   a first mirror stack over the substrate;
   an active region having a plurality of quantum wells over the first mirror stack;
   a tunnel junction over the active region, wherein a p-layer of the tunnel junction includes GaPSb or AlGaPSb; and
   a second mirror stack over the tunnel junction.

19. A long wavelength VCSEL according to claim 18, wherein an n-layer of the tunnel junction further includes a compound selected from the group consisting of InP, AlInAs, InGaAs, AlInGaAs and InGaAsP.

20. A long wavelength VCSEL according to claim 18, further including an n-type spacer adjacent the active region, and wherein the first mirror stack is an n-type DBR.

21. A long wavelength VCSEL according to claim 18, further including an p-type spacer adjacent the tunnel junction, and wherein the second mirror stack is an n-type DBR.

22. A long wavelength VCSEL according to claim 18, further including: an n-type bottom spacer adjacent the active region, and wherein the first mirror stack is an n-type DBR;
and an p-type top spacer adjacent the tunnel junction, wherein the first and second mirror stacks are each an n-type DBR.

* * * * *